(12) United States Patent
Aita et al.

(10) Patent No.: US 7,470,558 B2
(45) Date of Patent: Dec. 30, 2008

(54) METHOD FOR MANUFACTURING SOLID-STATE IMAGING DEVICE, AND SOLID-STATE IMAGING DEVICE

(75) Inventors: Tsutomu Aita, Miyagi (JP); Hideyasu Hanaoka, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 113 days.

(21) Appl. No.: 11/408,944

(22) Filed: Apr. 24, 2006

(65) Prior Publication Data
US 2006/0258041 A1 Nov. 16, 2006

(30) Foreign Application Priority Data
May 12, 2005 (JP) ............ P.2005-140163

(51) Int. Cl.
*H01L 21/00* (2006.01)
(52) U.S. Cl. ............... 438/57; 438/309; 257/E27.123; 257/E31.001
(58) Field of Classification Search ............. 438/57
See application file for complete search history.

(56) References Cited

U.S. PATENT DOCUMENTS 5,215,928 A * 6/1993 Hirai ............ 438/59

6,122,009 A * 9/2000 Ueda ............ 348/335

FOREIGN PATENT DOCUMENTS

JP 9-45884 A 2/1997

\* cited by examiner

*Primary Examiner*—Walter L Lindsay, Jr.
*Assistant Examiner*—Abdulfattah Mustapha
(74) *Attorney, Agent, or Firm*—Birch, Stewart, Kolasch & Birch, LLP (57) ABSTRACT

A method for manufacturing a solid-state imaging device, comprising: a step of forming an imaging portion comprising a photoelectric conversion portion and a charge transfer portion that transfers charges generated in the photoelectric conversion portion; and a step of forming a condensing lens over the imaging portion, wherein the step of forming the condensing lens comprises: a step of forming a lens substrate for forming a lens; a step of forming a first optical film having a lens shape by patterning the lens substrate; and a step of forming a second optical film on the first optical film by controlling a filming condition so as to form the lens having a desired curvature.

17 Claims, 9 Drawing Sheets

| ETCHING SELECTION RATIO PHOTORESIST / SiN | 0.88 | 0.98 | 1.29 | 1.49 |
|---|---|---|---|---|
| PROFILE |  |  |  |  |

METHOD FOR MANUFACTURING SOLID-STATE IMAGING DEVICE, AND SOLID-STATE IMAGING DEVICE

BACKGROUND OF THE INVENTION

1. Field of the Invention

The present invention relates to a method for manufacturing a solid-state imaging device and to the solid-state imaging device and, more particularly, to a treatment of the shape of a condensing lens for the solid-state imaging device.

2. Description of the Related Art

The solid-state imaging device using a CCD or an imaging device such as an area sensor is basically constituted to include a photoelectric conversion portion such as a photodiode, and a charge transfer portion having a plurality of charge transfer electrodes for transferring electric charges read out from the photoelectric conversion portion. The charge transfer electrodes are arranged adjacent to each other over a charge transfer channel formed on the surface of a semiconductor substrate, and are sequentially driven with a clock signal.

In recent years, the solid-state imaging device is made more and more miniaturized in its pixels by reducing its size and by increasing the number of imaging pixels. Accordingly, the miniaturization of the photoelectric conversion portion advances to make it difficult to keep the sensitivity high. In order to improve the sensitivity, therefore, there have been proposed a variety of constitutions (e.g., JP-A-9-45884) for enhancing the condensation efficiency on the photodiode by mounting a micro-lens on the surface of the pixel.

Figure 10:
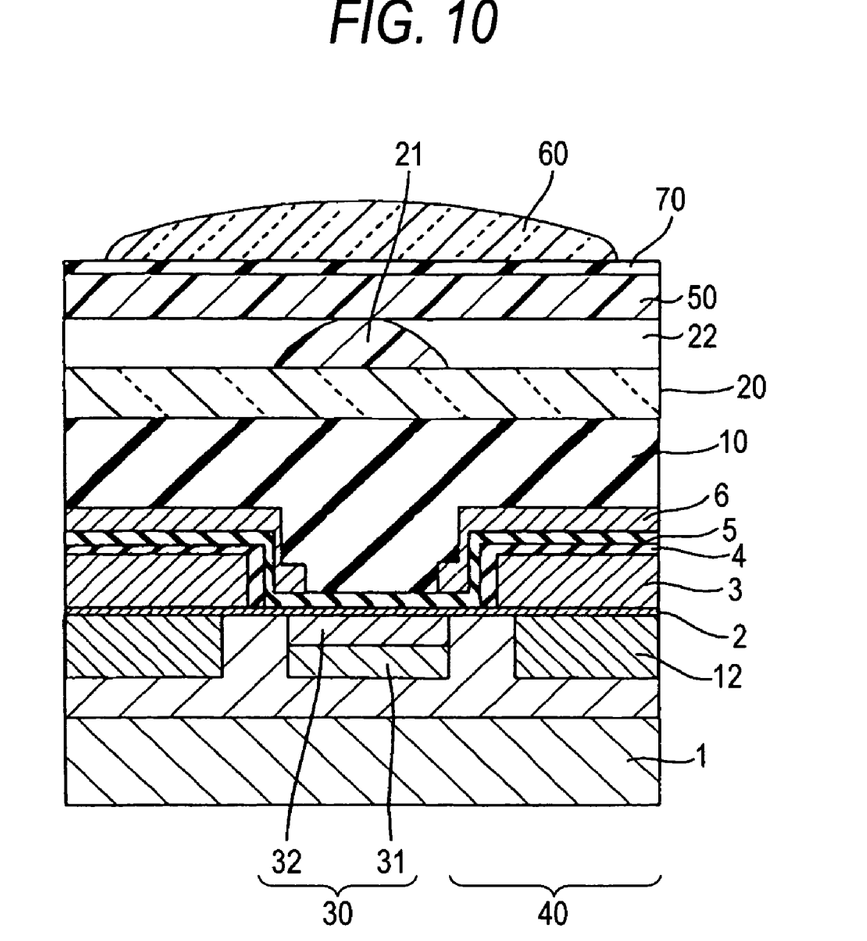
FIG. 10 is a schematic section of a solid-state imaging device of an example of the related art.

As one of them, as shown in FIG. 10, there has been proposed a constitution, in which a passivation film 20 is formed on a flattened layer 10 just above a photodiode portion 30 constituting the photoelectric conversion portion, in which an in-layer lens 21 is formed over the passivation film 20 and in which a flattened film 22, a color filter 50, a flattened film 70 and an on-chip lens 60 are formed over the in-layer lens 21 are formed sequentially in the recited order (although a charge transfer portion 40 and the photodiode portion 30 will be described herein after in connection with embodiments).

In the solid-state imaging device of the related art thus far described, both the two condensing lenses of the in-layer lens and the on-chip lens are formed by forming and transferring resist patterns. For example, the in-layer lens is manufactured in the following manner.

Figure 11A:
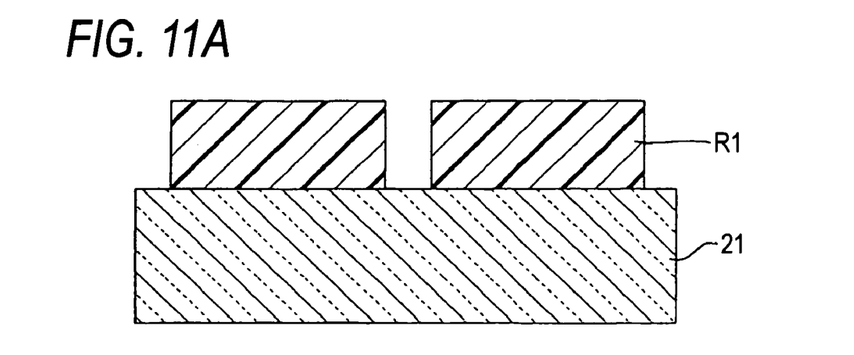
FIGS. 11A to 11C are sections of steps for manufacturing the solid-state imaging device of the example of the related art.
Figure 11B:
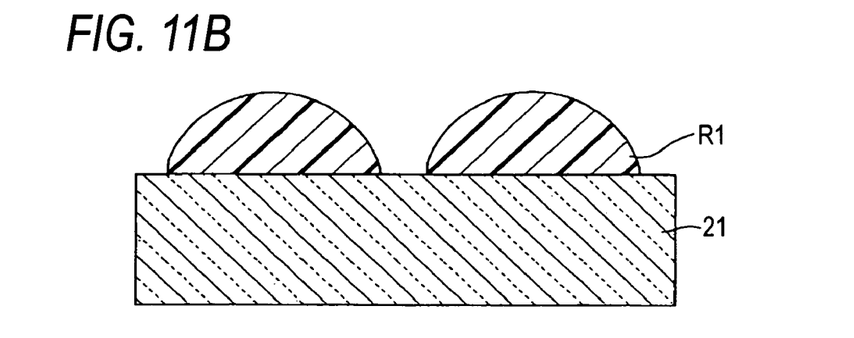
Figure 11C:
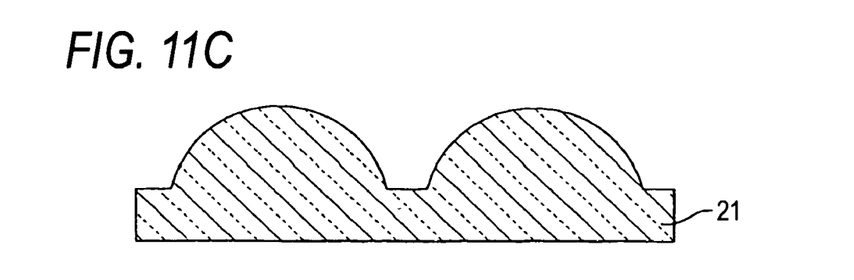

In this method, the photodiode portion, the charge transfer portion and the flattened film are formed at first. After this, a silicon nitride film to become the lens substrate 21 is formed, as schematically shown in FIG. 11A. A resist pattern R1 is formed over the silicon nitride film and is caused to reflow and set thereby to acquire a desired curvature (FIG. 11B). An anisotropic etching is performed by using that resist pattern R1 as a mask thereby to transfer the surface shape of the resist pattern R1 to the lens substrate made of the silicon nitride, so that the in-layer lens having the same curvature as that of the resist pattern R1 is formed (FIG. 11C).

In the method of the related art, as described hereinbefore, the shape obtained by the reflow of the resist pattern R1 becomes, as it is, the curvature of the condensing lens. The method has a problem that the curvature is so seriously changed by changing the reflow temperature as to make the curvature control extremely difficult.

SUMMARY OF THE INVENTION

The present invention has been conceived in view of the background thus far described, and has an object to provide a method for manufacturing a solid-state imaging device which can be easily manufactured to have a high sensitivity by controlling the curvature of a condensing lens highly precisely to form the condensing lens having a high condensation efficiency.

According to the invention, therefore, there is provided a method for manufacturing a solid-state imaging device, comprising: a step of forming an imaging portion comprising a photoelectric conversion portion and a charge transfer portion that transfers charges generated in the photoelectric conversion portion; and a step of forming a condensing lens over the imaging portion, wherein the step of forming the condensing lens comprises: a step of forming a lens substrate for forming a lens; a step of forming a first optical film having a lens shape by patterning the lens substrate; and a step of forming a second optical film on the first optical film by controlling a filming condition so as to form the lens having a desired curvature.

According to this constitution, the second optical film is formed by controlling the filming condition over the first optical film once formed, so that a fine adjustment can be made. The curvature can be controlled independently of the shape of the first optical film so that a lens shape excellent in the controllability can be obtained.

In the method of the invention, moreover, the step of forming the second optical film is a step of depositing the second optical film by the CVD method.

By this constitution, the adjustment on a time axis can be made to improve the controllability. Moreover, the shape control of a high precision can be easily realized by controlling the pressure, the gas flow rate and the power.

In the method of the invention, moreover, the step of forming the second optical film is a step of depositing the second optical film by a coating method.

According to this constitution, the shape can be easily controlled by adjusting the speed of a spinner used for a viscous application of the applied film and by adjusting the setting temperature.

In the solid-state imaging device manufacturing method of the invention, moreover, said second optical film forming step includes the step of forming the applied film.

According to this constitution, the adjustment can be easily made.

In the method of the invention, moreover, the step of forming the first optical film comprises: a step of forming a resist pattern on the lens substrate; and a step of transferring the resist pattern to the lens substrate by etching the lens substrate, using the resist pattern as a mask.

According to this constitution, the resist pattern is formed by applying and patterning the resist, and by causing the resist pattern to reflow into the desired shape. Even if the highly precise resist pattern shape can not be obtained by the reflow, it can be adjusted by the second optical film so that the desired curvature can be easily obtained.

In the method of the invention, moreover, the transferring step comprises a step of patterning the lens substrate to a desired curvature by adjusting an etching selection ratio between the resist pattern and the lens substrate.

By adjusting the etching selection rate between the resist pattern and the lens substrate, the lens substrate can be patterned to the desired curvature easily by the fine adjustment. Therefore, the lens substrate can be controllably worked into the desired shape to attain the highly precise and controllable lens.

In the method of the invention, moreover, the step of forming the second optical film comprises a step of controlling a pressure.

According to this constitution, the shape can be formed easily and controllably into the desired one so that the highly precise and controllable lens can be obtained.

In the method of the invention, moreover, the step of forming the second optical film comprises a step of adjusting a gas flow rate at filming time.

According to this constitution, the shape can be formed easily and controllably into the desired one so that the highly precise and controllable lens can be obtained.

In the method of the invention, moreover, the step of forming the second optical film comprises a step of controlling the curvature to a desired one by using silane, ammonia and nitrogen as material gases and by adjusting the flow rate of nitrogen.

According to this constitution, the shape can be formed easily and controllably into the desired one so that the highly precise and controllable lens can be obtained. If the flow rate of nitrogen is reduced, the concentration of the reactive gas rises so that the overhang is suppressed to improve the step coverage ratio while reducing the curvature of the lens. If the flow rate of nitrogen is increased, on the other hand, the concentration of the reactive gas lowers so that the step coverage ratio drops to enlarge the curvature.

In the method of the invention, moreover, the step of forming the second optical film comprises a step of adjusting power at filming time.

According to this constitution, the shape can be formed easily and controllably into the desired one so that the highly precise and controllable lens can be obtained.

In the solid-state imaging device manufacturing method of the invention, moreover, the step of forming the condensing lens is a step of forming an in-layer lens.

According to this constitution, the curvature of the in-layer lens can be controllably formed to improve the condensability.

In the solid-state imaging device manufacturing method of the invention, moreover, the step of forming the condensing lens is a step of forming an on-chip lens.

According to this constitution, the curvature of the on-chip lens can be controllably formed to improve the condensability.

In the solid-state imaging device manufacturing method of the invention, moreover, the first optical film is configured by a silicon nitride film.

According to this constitution, the various etching conditions can be selected to attain a desired resist transfer factor.

In the solid-state imaging device manufacturing method of the invention, moreover, the transferring step further comprises a step of controlling the curvature by adjusting a flow ratio between a fluorocarbon gas and an oxygen gas to control the etching selection ratio.

According to this constitution, a desired curvature can be extremely easily attained by adjusting the flow ratio of gases.

In the solid-state imaging device manufacturing method of the invention, moreover, the second optical film is configured by a silicon nitride film.

According to this constitution, the desired curvature can be easily attained by controlling the filming condition.

In the solid-state imaging device manufacturing method of the invention, moreover, the second optical film is configured by an organic film.

According to this constitution, the application can be easily performed.

The solid-state imaging device manufacturing method of the invention further comprises a step of forming a third optical film over the second optical film.

According to this constitution, after the once shaping treatment, a finer adjustment can be made by adjusting the deposition characteristics of the laminated films, thereby to provide a condensing lens having a curvature of a highly excellent condensability.

In the solid-state imaging device manufacturing method of the invention, moreover, the step of forming the third optical film comprises a step of applying an organic film.

According to this constitution, the application can be easily performed.

Moreover, a solid-state imaging device is obtained by the aforementioned solid-state imaging device manufacturing method.

In the solid-state imaging device of the invention, moreover, the condensing lens comprises: a first optical film; and a second optical film formed to cover the first optical film, the second optical film having a contour of a curvature different from that of the first optical film.

The condensing lens thus formed can have a remarkably high curvature controllability and can enhance the condensability to provide a highly sensitive solid-state imaging device.

In the solid-state imaging device of the invention, moreover, the condensing lens comprises: a first optical film; a second optical film formed to cover the first optical film, the second optical film being configured by an inorganic film having a contour of a curvature different from that of the first optical film; and a third optical film configured by an organic film formed over the second optical film.

According to this constitution, the fine adjustment can be more facilitated to provide the condensing lens having the desired optical characteristics easily and controllably. By the three-layered constitution, moreover, a combination of high adhesion can be easily selected to provide a highly reliable lens more easily.

According to this constitution, the condensing lens is formed in the laminated structure so that the controllability is excellent.

DETAILED DESCRIPTION OF THE INVENTION

Next, embodiments of the invention are described in detail with reference to the accompanying drawings.

EMBODIMENT 1

Figure 1:
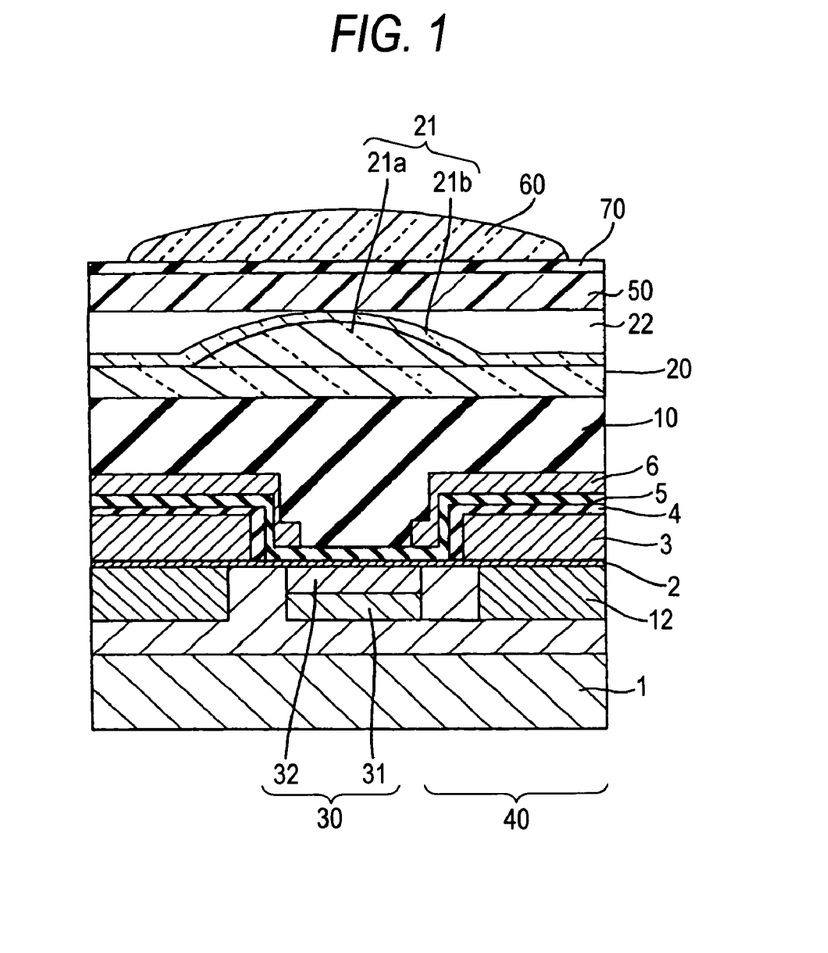
FIG. 1 is a schematic section of a solid-state imaging device obtained by a method of Embodiment 1 of the invention.
Figure 2:
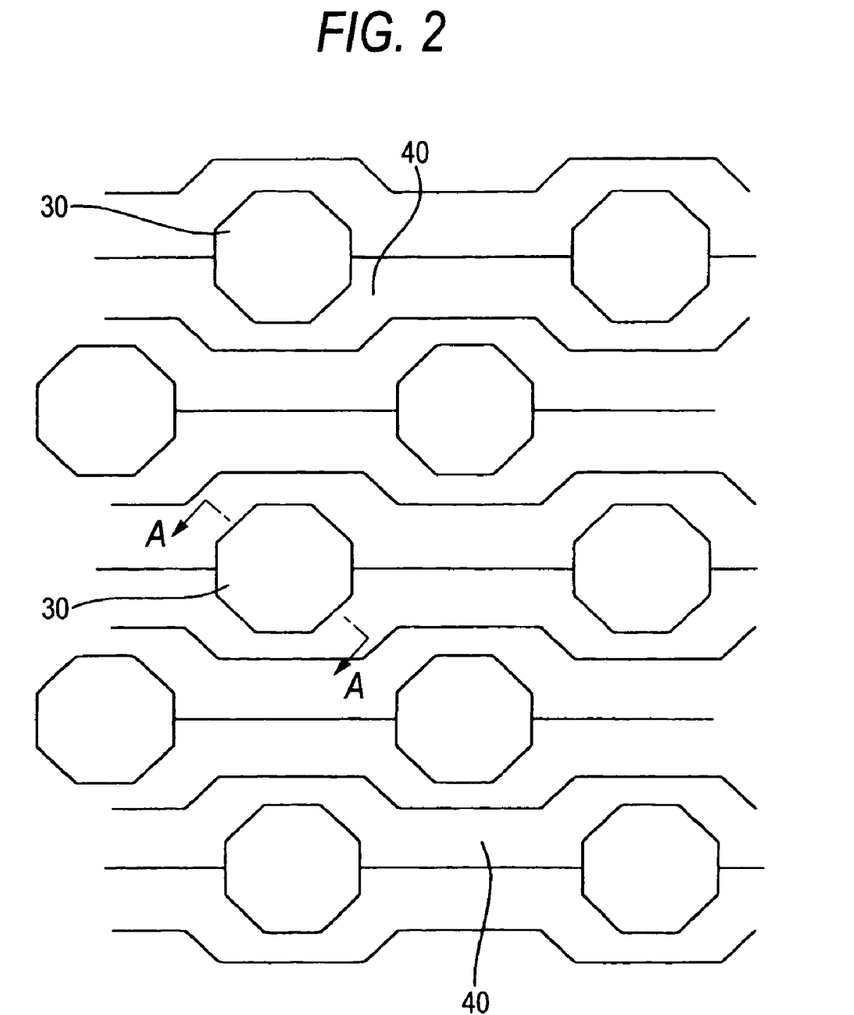
FIG. 2 is a top plan view of the solid-state imaging device of Embodiment 1 of the invention.

FIG. 1 is a sectional view showing an essential portion of a solid-state imaging device, and FIG. 2 is a top plan view of an essential portion of an imaging region. FIG. 1 is an A-A section of FIG. 2. This solid-state imaging device is characterized in that an in-layer lens 21 formed through a flattened film over a photodiode portion 30 acting as a photoelectric conversion portion is composed of a first optical film 21a formed by patterning a lens substrate and having a lens shape, and a second optical film 21b formed by the CVD method over the first optical film 21a and made of a silicon nitride film. Here, the second optical film 21b is characterized in that it is so formed by adjusting the filming condition at the CVD step as to have a surface shape of a larger curvature than that of the first optical film 21a.

Over the imaging portion of the solid-state imaging device, the aforementioned passivation film 20, the in-layer lens 21, a second flattened layer 22, a color filter 50, a third flattened layer 70 and a micro-lens 60 are laminated sequentially in the recited order through a first flattened layer 10 made of a BPSG film formed through an silicon oxide film.

Specifically, this solid-state imaging device is constituted, as shown in FIG. 1, to comprise the photodiode portion 30 formed on a silicon substrate 1 and having a pn junction, and a charge transfer portion 40 having a charge transfer electrode 3 formed over a gate oxide film 2, for transferring charges excited in the photodiode portion 30.

The imaging region of the solid-state imaging device is formed, as shown as a schematic top plan view in FIG. 2. A plurality of photodiode portions 30 and the charge transfer portions 40 for transferring signal charges detected at the photodiode portions 30 are formed over the silicon substrate such that the charge transfer portions 40 exhibit meandering shapes between the photodiode portions 30. The charge transfer channels, through which the signal charges to be transferred by the charge transfer portions 40 move, are also formed to exhibit meandering shapes, although not shown in FIG. 2, in a direction to intersect the extending direction of the charge transfer portions 40.

Moreover, a p-well is formed in the silicon substrate 1, and an n-type impurity region 31 forming a pn junction with the p-well and a p-type impurity region 32 highly doped as a surface potential adjusting layer formed on the surface of that n-type impurity region form together a photodiode.

Over that charge transfer electrode 3, moreover, there is formed a reflection preventing film 5 of a silicon nitride film through an insulating film 4 made of a silicon oxide film. Over the reflection preventing film 5, moreover, there is formed a tungsten thin film as shielding layer 6 having an opening in the light receiving region of the photodiode portion 30, through a titanium nitride layer formed by the sputtering method.

A process for manufacturing the solid-state imaging device is briefly described in the following.

The photodiode and the charge transfer portion are formed by the ordinary method, although their descriptions are omitted.

Moreover, a (not-shown) silicon oxide film is formed by the plasma CVD method on the surface of the substrate 1 having the photodiode and the charge transfer electrode formed thereon, and a BPSG film (10) having a thickness of 300 nm is formed by the atmospheric thermal CVD method.

After this, the substrate 1 is heated and annealed in a furnace to 800 to 850° C. so that the BPSG film is caused to reflow and is flattened to form the first flattened layer 10 (as referred to FIG. 1).

Figure 3A:
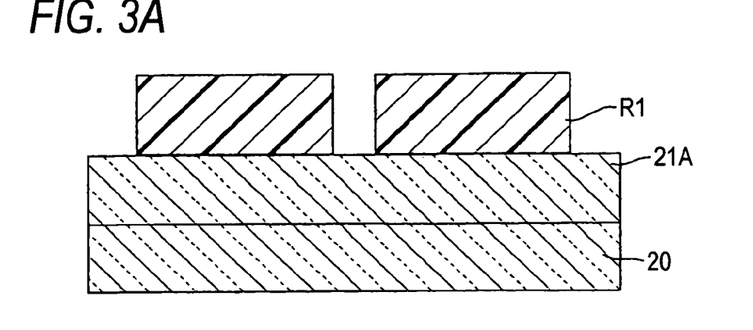
FIGS. 3A to 3D are sectional views showing steps for manufacturing the solid-state imaging device of Embodiment 1 of the invention.

Over the first flattened layer 10, moreover, a silicon nitride film is formed as the passivation film 20 by the plasma CVD method, and the lens substrate 21A made of a silicon nitride film having a thickness of about 0.300 nm to become the in-layer lens is then formed by the plasma CVD method (FIG. 3A). (Although the layers over the lens substrate are exclusively shown, it is assumed that the passivation film 20 shown in FIG. 1 is formed below the lens substrate 21A.)

Figure 3B:
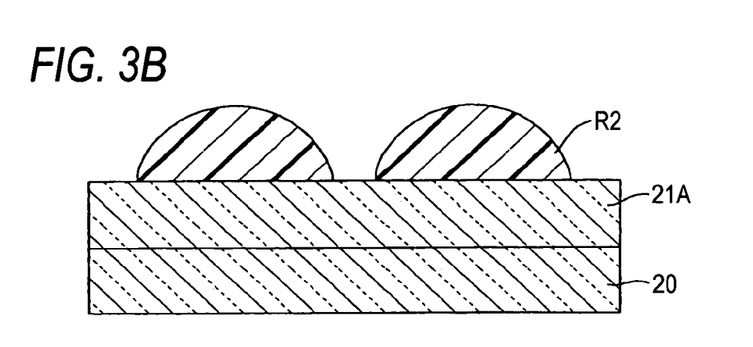

Moreover, a resist is applied over the lens substrate 21 and is patterned by the photolithography to form a resist pattern R1, as shown in FIG. 3A. After this, the resist pattern R1 is then subjected to a heat treatment of 120 to 140° C., for example, to reflow so that it is rounded at its corners by the surface tension and is cooled to become hard (FIG. 3B).

Figure 3C:
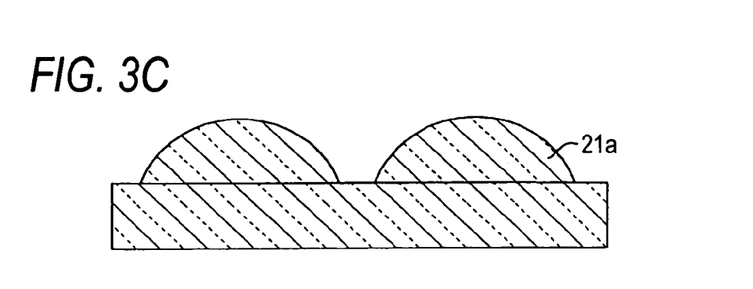

After this, as shown in FIG. 3C, that resist pattern R2 is used as a mask to perform a dry etching (the etching conditions of which are: $CF_4/Ar/He/O_2=75/125/50/40$ sccm; the pressure of 70 Pa; the RF power of 900 W; and the stage for placing the substrate set at 80° C.), thereby to form the first optical film 21a which is made of the silicon nitride film having a spherical shape of a larger radius of curvature than that of the spherical shape of the aforementioned resist pattern R2.

Figure 3D:
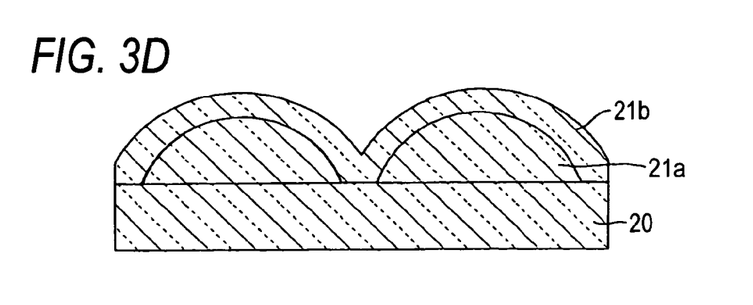

After this, a second optical film 21b having a larger curvature than that of the first optical film 21a is formed over the first optical film 21a by the plasma CVD method while adjusting the filming conditions as shown in FIG. 3D. Here: the pressure in the chamber is 4.5 Torr; the RF power is 720 W; the temperature is 400° C.; the electrode distance is 600 mm; silane $SiH_4$ is 275 sccm; ammonia $NH_3$ is 100 sccm; and nitrogen $N_2$ is 4,000 sccm. Here, the aspect ratio of the silicon nitride film to be formed is adjusted by controlling only the flow rate of nitrogen.

After this, through the (not-shown) silicon oxide films, the second flattened film 22 of an organic film, the color filter 50 having three colors R, G and B sequentially juxtaposed, the third flattened film 70 of an organic film, and a convex micro-lens 60 of a resist are formed by the ordinary method thereby to form the solid-state imaging device, as shown in FIG. 1.

In the related art, the resist pattern R2 having the shape determined by the reflow conditions of the resist pattern R1 is obtained by transferring it. According to this embodiment, on the other hand, the filming conditions are adjusted to give a larger radius of curvature than the curvature of the underlying first optical film pattern R2. Therefore, the second optical film 21b having the desired radius of curvature can be controllably formed to form the in-layer lens having the laminated structure of the first optical film 21a and the second optical film 21b, thereby to improve the optical condensability.

Next, the flow rate ratio of the nitrogen gas is changed to adjust a step coverage.

Figure 4A:
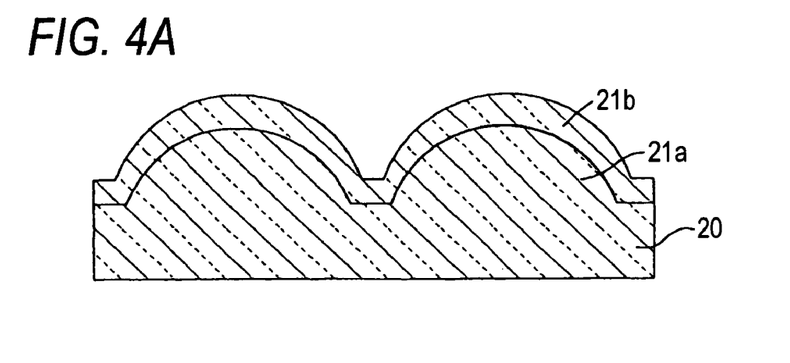
FIGS. 4A and 4B are sectional views showing steps for manufacturing the solid-state imaging device of Embodiment 1 of the invention.
Figure 4B:
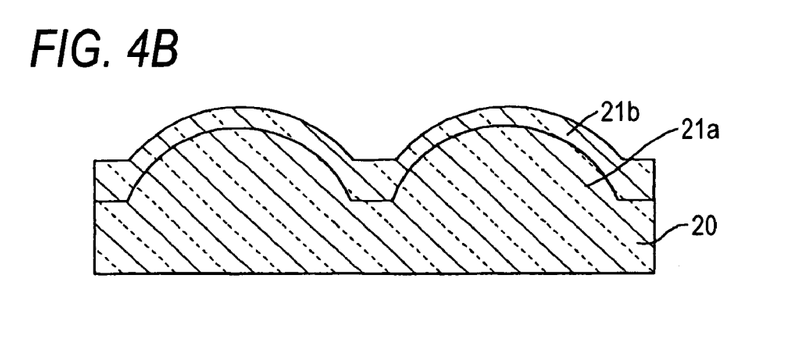

A sectional shape of the in-layer lens at the time when only the flow rate of nitrogen is set at 1,500 sccm is shown in FIG. 4A. As a result, it is found that an overhang can be suppressed, when the nitrogen flow rate is reduced, to improve the step coverage ratio. On the contrary, when the nitrogen flow ratio is so increased with the similar conditions that the nitrogen flow rate is set to 4,500 sccm, the step coverage ratio is reduced so that the lens shape can have a large radius of curvature, as shown in FIG. 4B.

Figure 5:
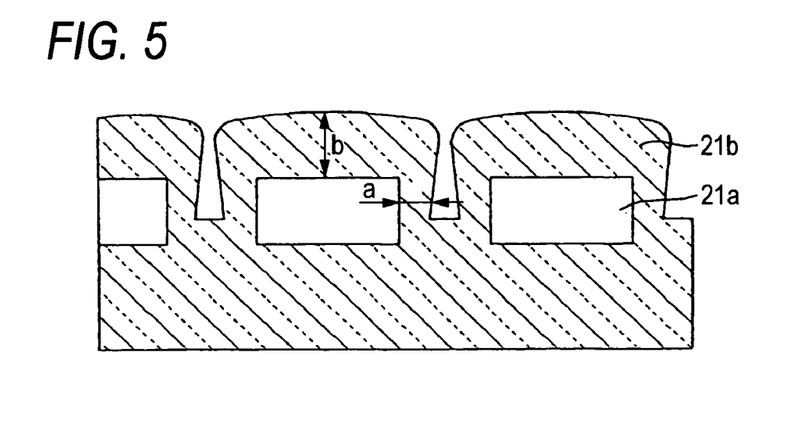
FIG. 5 is a sectional view showing a step for manufacturing the solid-state imaging device of Embodiment 1 of the invention.

Next, in order to verify the step coverage, a test pattern is used to measure the step coverage to the nitrogen flow rate. When the silicon nitride film is formed under the aforementioned CVD conditions over a rectangular pattern, the ratio of a film thickness b on the pattern to a thickness a of the side wall of the pattern is measured. When the nitrogen flow rate is 4,500 sccm, it is found that the ratio of b/a=41% is obtained, as shown in FIG. 5, to form the overhang shape.

Figure 6A:
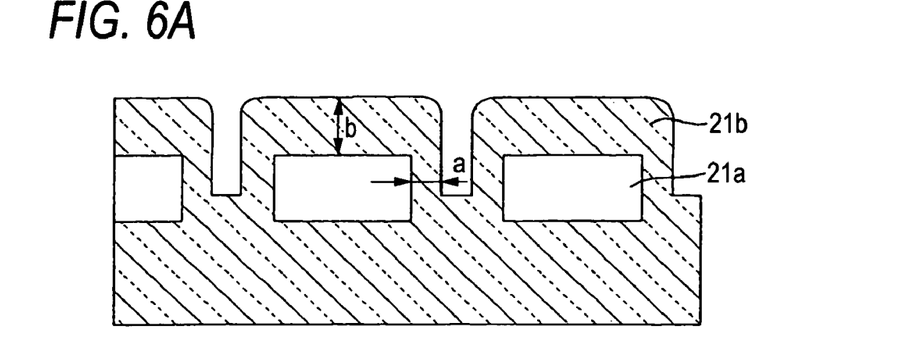
FIGS. 6A and 6B are sectional views showing steps for manufacturing the solid-state imaging device of Embodiment 1 of the invention.
Figure 6B:
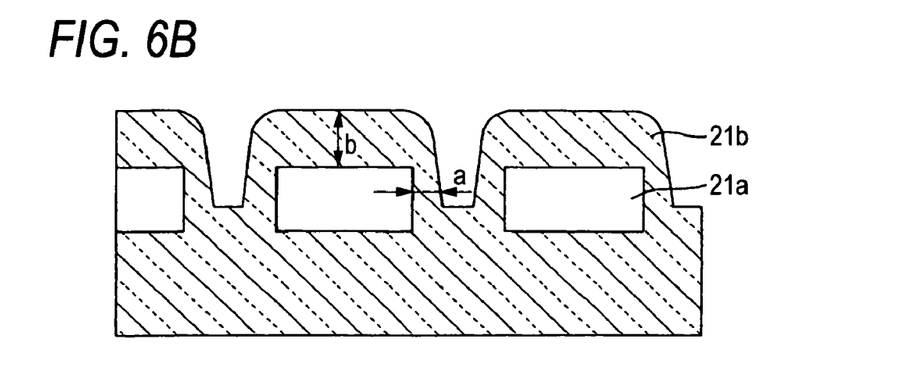

On the other hand, when the nitrogen flow rate is 1,500 sccm for a smaller nitrogen flow ratio while keeping other conditions similar, the step coverage ratio increases so that the step coverage can be improved, as shown in FIGS. 6A and 6B, to provide a lens shape of a small radius of curvature. At this time, moreover, the ratio of b/a is also changed by the spacing of the pattern, i.e., by the line and space ratio. When this line and space ratio is 1, the ratio of b/a=60%, as shown in FIG. 6A. When the space is made larger, the ratio of b/a=75%, as shown in FIG. 6B, even under similar other conditions. By thus adjusting the underlying pattern and the filming conditions, the curvature can be controlled highly precisely to make the fine adjustment more efficiently thereby to provide the in-layer lens of a more desirable shape.

At this time, moreover, the shape of the first optical film can also be adjusted to make the fine adjustment more efficiently thereby to provide the in-layer lens of a more desirable shape.

Here is described the adjustment of the shape of the first optical film to be formed below the second optical film.

Figure 7:
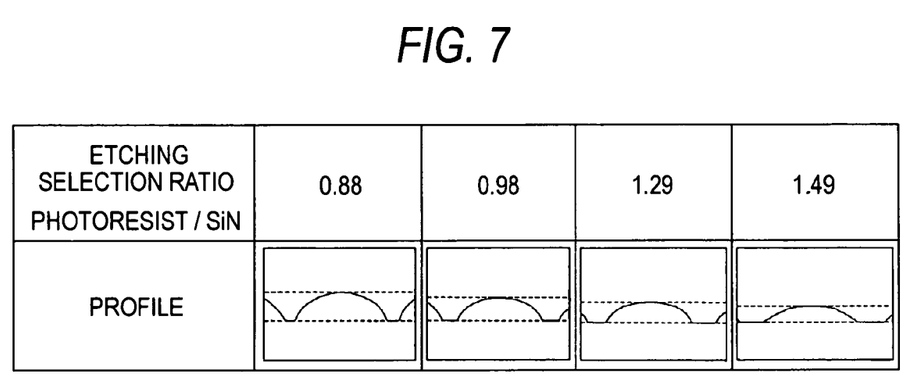
FIG. 7 is a sectional view showing a step for manufacturing the solid-state imaging device of Embodiment 1 of the invention.

The flow ratio of the etching gas is changed to change the etching selection ratio from 0.88 to 1.49, and the shape of the in-layer lens obtained is observed. The result is shown in FIG. 7. The radius of curvature is small, when the etching selection ratio is smaller than 1, but is large when the etching selection ratio is larger than 1. This result apparently reveals that the curvature of the lens can be controllably adjusted.

The embodiment uses the silicon nitride film as the lens substrate, but the etching selection ratio may also be adjusted by using a resist having a slightly different composition.

EMBODIMENT 2

Embodiment 2 of the invention is described in the following.

Figure 8:
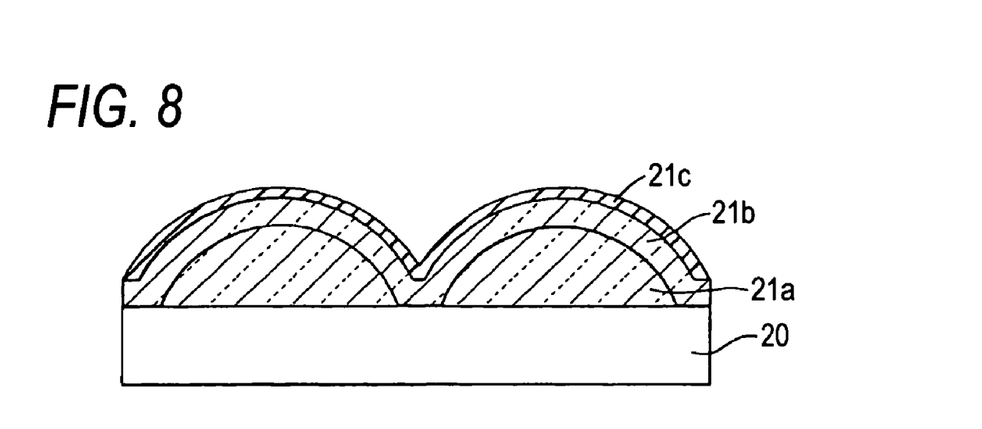
FIG. 8 is a sectional view showing a step for manufacturing the solid-state imaging device of Embodiment 2 of the invention.

The invention has been described on the in-layer lens having the two-layered constitution, but may have a three-layered constitution. In this embodiment, as shown in FIG. 8, an organic film 21c or an applied film is laminated over the first optical film and the second optical film, which have been laminated by the method of Embodiment 1.

As a result, the radius of curvature can be remarkably easily enlarged while the passivation being enhanced.

According to this method, the desired curvature can be obtained more controllably. At this time, the second optical film acting as the curvature adjusting layer may be formed of either the same material as that of the lens substrate but under different filming conditions or another material.

In addition, the central portion and the peripheral edge portion of the substrate have tendencies that the peripheral edge portion is lower at the center axis of the lens, and that the curvature is dispersed. However, this in-plane dispersion can also be reduced.

As a result, the optical condensation efficiency can be enhanced to make the solid-state imaging device highly sensitive.

EMBODIMENT 3

Embodiment 3 of the invention is described in the following.

Figure 9:
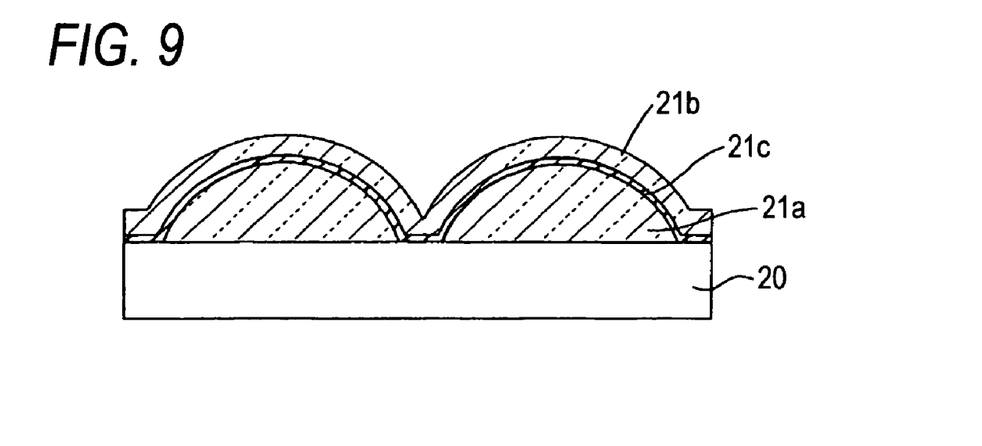
FIG. 9 is a sectional view showing a step for manufacturing the solid-state imaging device of Embodiment 3 of the invention.

In the aforementioned Embodiment 2, the third optical film is laminated on the second optical film. As shown in FIG. 9, however, prior to the formation of the second optical film, the third optical film 21c may also be formed as the applied film for the adjustment, and the second optical film may be further formed over the third optical film 21c.

As a result, the radius of curvature can be remarkably easily enlarged. It is further possible to enhance the passivation.

Although the foregoing embodiments have been described on the in-layer lens, it is needless to say that the invention can also be applied to an on-chip lens.

Here, the invention should not be limited to the aforementioned embodiments, but can be suitably adjusted within the scope of the technical concept thereof.

According to the invention, as has been described hereinbefore, the in-layer lens or the on-chip lens is controlled not only by controlling the resist pattern but also by adjusting the etching condition. For the curvature of the resist pattern, therefore, the curvature of the lens obtained can be controllably adjusted to provide a highly sensitive solid-state imaging device with remarkable ease and workability.

According to the method for manufacturing the solid-state imaging device of the invention thus far described, the condensation efficiency can also be enhanced even for miniaturization so that the solid-state imaging device can be small-sized and easily manufactured. Thus, the solid-state imaging device is remarkably efficient for a small-sized imaging element to be used in a digital camera or a mobile telephone.

The entire disclosure of each and every foreign patent application from which the benefit of foreign priority has been claimed in the present application is incorporated herein by reference, as if fully set forth.

What is claimed is:

1. A method for manufacturing a solid-state imaging device, comprising:
    a step of forming an imaging portion comprising a photoelectric conversion portion and a charge transfer portion that transfers charges generated in the photoelectric conversion portion; and
    a step of forming a condensing lens over the imaging portion,
    wherein the step of forming the condensing lens comprises:
    a step of forming a lens substrate for forming a lens;
    a step of forming a first optical film having a lens shape by patterning the lens substrate; and
    a step of forming a second optical film on the first optical film by controlling a filming condition so as to form the lens having a desired curvature.

2. The method as set forth in claim 1,
    wherein the step of forming the second optical film is a step of depositing the second optical film by the CVD method.

3. The method as set forth in claim 1,
    wherein the step of forming the second optical film is a step of depositing the second optical film by a coating method.

4. The method as set forth in claim 1,
    wherein the step of forming the first optical film comprises:
    a step of forming a resist pattern on the lens substrate; and
    a step of transferring the resist pattern to the lens substrate by etching the lens substrate, using the resist pattern as a mask.

5. The method as set forth in claim 4,
    wherein the transferring step comprises a step of patterning the lens substrate to a desired curvature by adjusting an etching selection ratio between the resist pattern and the lens substrate.

6. The method as set forth in claim 2,
    wherein the step of forming the second optical film comprises a step of controlling a pressure.

7. The method as set forth in claim 2,
    wherein the step of forming the second optical film comprises a step of adjusting a gas flow rate at filming time.

8. The method as set forth in claim 7,
wherein the step of forming the second optical film comprises a step of controlling the curvature to a desired one by using silane, ammonia and nitrogen as material gases and by adjusting the flow rate of nitrogen.

9. The method as set forth in claim 2,
wherein the step of forming the second optical film comprises a step of adjusting power at filming time.

10. The method as set forth in claim 1,
wherein the step of forming the condensing lens is a step of forming an in-layer lens.

11. The method as set forth in claim 1,
wherein the step of forming the condensing lens is a step of forming an on-chip lens.

12. The method as set forth in claim 1,
wherein the first optical film is configured by a silicon nitride film.

13. The method as set forth in claim 5,
wherein the transferring step further comprises a step of controlling the curvature by adjusting a flow ratio between a fluorocarbon gas and an oxygen gas to control the etching selection ratio.

14. The method as set forth in claim 1,
wherein the second optical film is configured by a silicon nitride film.

15. The method as set forth in claim 1,
wherein the second optical film is configured by an organic film.

16. The method as set forth in claim 1, further comprising a step of forming a third optical film over the second optical film.

17. The method as set forth in claim 16,
wherein the step of forming the third optical film comprises a step of applying an organic film.

* * * * *